United States Patent
Aikawa et al.

(10) Patent No.: US 7,145,404 B2
(45) Date of Patent: Dec. 5, 2006

(54) INJECTION LOCKED HIGH FREQUENCY OSCILLATOR

(75) Inventors: Masayoshi Aikawa, Saga (JP); Takayuki Tanaka, Saga (JP); Fumio Asamura, Saitama (JP); Takeo Oita, Saitama (JP)

(73) Assignees: Nihon Dempa Kogyo Co., Ltd., Shibuya-ku (JP); Saga University, Saga (JP)

( * ) Notice: Subject to any disclaimer, the term of this patent is extended or adjusted under 35 U.S.C. 154(b) by 55 days.

(21) Appl. No.: 11/046,515

(22) Filed: Jan. 28, 2005

(65) Prior Publication Data

US 2005/0184816 A1    Aug. 25, 2005

(30) Foreign Application Priority Data

Jan. 29, 2004    (JP)    ............................. 2004-020808

(51) Int. Cl.
*H03B 7/12*    (2006.01)
(52) U.S. Cl. .................... 331/96; 331/56; 331/107 P; 331/107 SL; 331/107 DP; 331/117 D; 333/219.1
(58) Field of Classification Search ................. 331/96, 331/117 D, 56, 107 P, 107 SL, 107 DP; 333/219.1
See application file for complete search history.

(56) References Cited

U.S. PATENT DOCUMENTS 6,703,904 B1 *    3/2004    Aikawa et al. ................ 331/56
2004/0233004 A1 *    11/2004    Asamura et al. ...... 331/107 DP

FOREIGN PATENT DOCUMENTS

JP    2004-096693    3/2004

* cited by examiner

*Primary Examiner*—Robert Pascal
*Assistant Examiner*—Levi Gannon
(74) *Attorney, Agent, or Firm*—Muirhead & Saturnelli, LLC (57) ABSTRACT

A push-push high frequency oscillator comprises a pair of amplifiers for oscillation, a loop-shaped microstrip line for connecting inputs of the pair of amplifiers to each other and connecting outputs of the pair of amplifiers to each other, a slot line disposed between the inputs and the outputs of the pair of amplifiers for electromagnetically coupling with the microstrip line, a nonlinear circuit for enhancing the level of harmonic components in an applied synchronization signal, a coupler circuit for electromagnetically coupling the output of the nonlinear circuit to the microstrip line, and a filter circuit disposed at the output of the nonlinear circuit. The filter circuit filters harmonic components of the synchronization signal such that the two oscillation systems are injected with the same frequency components as the fundamental wave or frequency components twice as high as the fundamental wave to increase frequency stability.

12 Claims, 9 Drawing Sheets

INJECTION LOCKED HIGH FREQUENCY OSCILLATOR

BACKGROUND OF THE INVENTION

1. Field of the Invention

The present invention relates to a harmonic high frequency oscillator for generating frequency outputs, which are even-order harmonics of a fundamental wave of an oscillation frequency through so-called push-push oscillation for use in a millimeter-wave band and a microwave band, and more particularly, to a high frequency oscillator which achieves improved phase noise characteristics and frequency pull-in through injection locking.

2. Description of the Related Art

A push-push oscillation based oscillator is known as suitable for generating oscillation signals in a millimeter-wave band and a microwave band. The oscillator based on push-push oscillation based employs a pair of oscillation circuits which operate at the same fundamental frequency but in opposite phases to each other, and combines the outputs from these oscillation circuits to cancel out the fundamental wave component and extract even-order harmonic components to the outside. Such push-push oscillators are used in a variety of applications because of its simple configuration and its ability to generate output frequencies twice or more as high as fundamental wave f0, and are useful, for example, as an oscillation source for a high frequency network which operates, for example, in association with fiber-optic cables, or as an oscillation source for measuring devices. The present inventors have proposed, for example, a high frequency oscillator in Japanese Patent Laid-open Publication No. 2004-96693 (JP, P2004-96693A), which is further reduced in size to facilitate its design and generates, for example, even-order harmonics of second harmonic 2f0 or higher harmonics from fundamental wave f0.

Figure 1A:
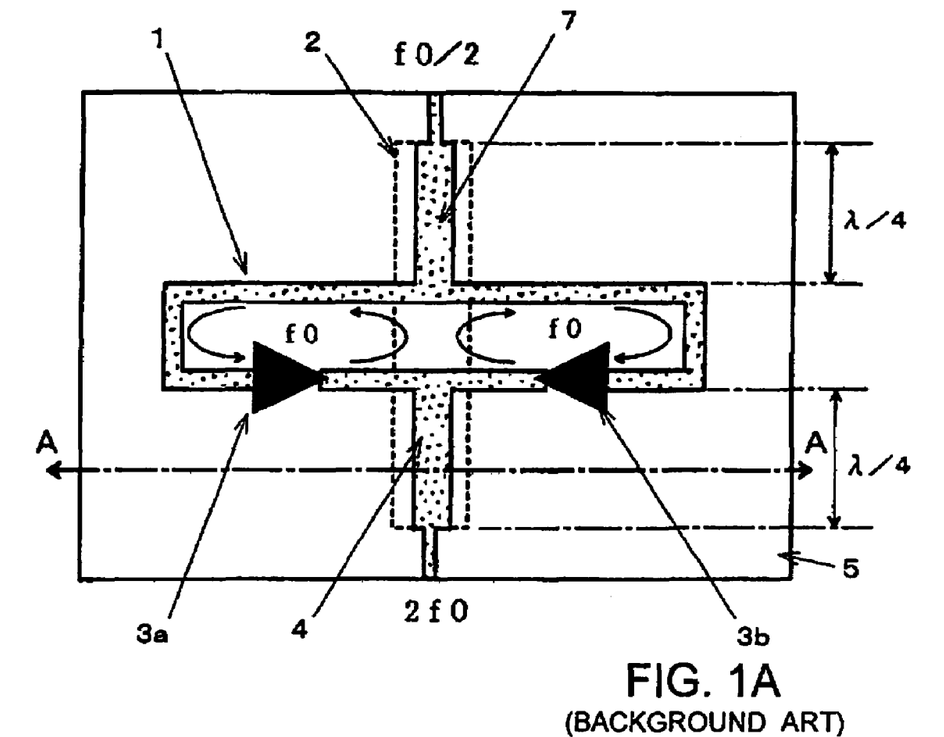
FIG. 1A is a plan view illustrating the configuration of a conventional second-harmonic oscillator which generates a second harmonic component, which is a frequency component twice as high as a fundamental wave.
Figure 1B:
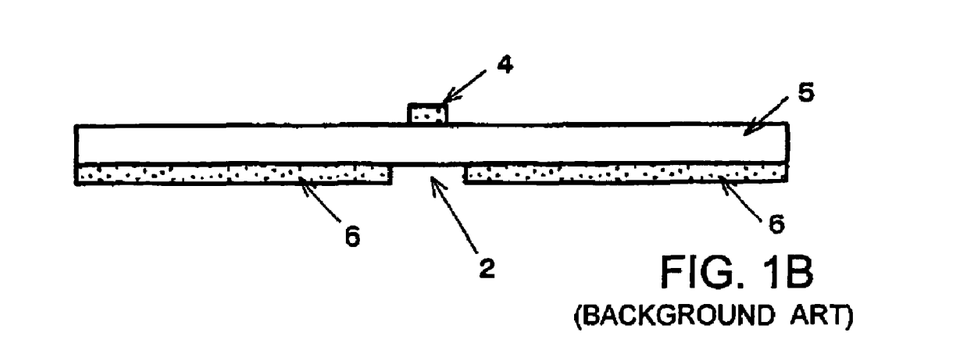
FIG. 1B is a cross-sectional view taken along line A—A in FIG. 1A.

FIG. 1A is a plan view illustrating the configuration of a conventional second-harmonic oscillator for generating a frequency component twice as high as a fundamental wave, i.e., a second harmonic component, and FIG. 1B is a cross-sectional view taken along a line A—A in FIG. 1A.

Basically, a second-harmonic oscillator comprises a pair of amplifiers 3a, 3b for oscillation; microstrip line 1 which serves as a high frequency transmission line within oscillation systems; and slot line 2 for coupling. Slot line 2 functions as an electromagnetic coupler for causing the two oscillation systems to oscillate in opposite phases to each other.

Microstrip line 1 for oscillation is routed on one principal surface of dielectric substrate 5, and ground conductor 6 is formed substantially over the entirety of the other principal surface of dielectric substrate 5. Here, microstrip line 1 is formed in a closed loop substantially in a rectangular shape.

The pair of amplifiers 3a, 3b for oscillation, each comprised of an FET (Field Effect Transistor) or the like, have their output terminals disposed on the one principal surface of dielectric substrate 5 in a mutually opposing relationship, and are inserted in microstrip line 1. In this way, microstrip line 1 connects input terminals of the pair of amplifiers 3a, 3b for oscillation to each other, and the output terminals of the same to each other.

Slot line 2 is implemented by an aperture line formed in ground conductor 6 on the other principal surface of substrate 5, and is routed to vertically traverse two sections in central portions of microstrip line 1 which is routed on the one principal surface of substrate 5. Slot line 2 extends upward and downward by $\lambda/4$ respectively from the sections of microstrip line 1 which are traversed by slot line 2, where $\lambda$ represents the wavelength corresponding to an oscillation frequency (i.e., fundamental wave f0), later described. Microstrip line 4 for output is routed on the one principal surface of substrate 5 and superimposed on slot line 2. Microstrip line 4 is connected to the center of a portion of microstrip line 1 (the lower side in the figure) which connects between the outputs of the pair of amplifiers 3a, 3b for oscillation. Injection line 7 is also connected to a midpoint of microstrip line 1 which connects between inputs of the pair of amplifiers 3a, 3b for oscillation. Injection line 7, which has a microstrip line structure, is arranged to overlie slot line 2.

In the foregoing oscillator, microstrip line 1 is electromagnetically coupled to slot line 2 to form two oscillation systems, as shown in the left and right halves of the figures. In this configuration, a high frequency signal in an unbalanced propagation mode, which propagates through microstrip line 1, is converted into a balanced propagation mode of slot line 2. Since the balanced propagation mode of slot line 2 involves a propagation which presents opposite phases at both sides of the aperture line, eventually causing the two oscillation systems to oscillate in opposite phases to each other. Since the oscillation frequency (i.e., fundamental wave f0) in the oscillation systems generally depends on the length of each oscillation closed loop or on a phase shift amount in the loop, the oscillation systems are designed such that the respective oscillation systems oscillate at the same oscillation frequency.

At the midpoint of microstrip line 1 which connects between the outputs of the pair of amplifiers 3a, 3b for oscillation to each other, the fundamental wave (f0) component and odd-order harmonic components in the oscillation frequencies are in opposite phases to each other to provide null potential. On the other hand, even-order harmonics of a second harmonic or higher are combined for delivery. However, since higher harmonics of a fourth harmonic or higher have relatively low levels as compared with the second harmonic, the fundamental wave f0 and other harmonics are suppressed to supply second harmonic 2f0 on output line 4. Here, if the oscillator is designed to suppress second harmonic 2f0 as well, the oscillator can provide fourth harmonic 4f0 which has the next highest level.

Further, injection line 7 is injected with a synchronization signal at frequency f0/n, where n is an integer equal to or larger than one. This synchronization signal is injected into both oscillation systems in phase. This causes the oscillator to oscillate in synchronization with the synchronization signal, improving the frequency accuracy of the second-harmonic oscillator to as high as the frequency accuracy of the synchronization signal. For example, assuming n=1, fundamental wave f0 of each oscillation system is aligned in phase at time intervals of 1/f0, thus increasing the frequency stability of the oscillator following the frequency stability of a synchronization signal source. As such, the frequency stability can be improved for the second-harmonic oscillator by generating the synchronization signal from an oscillation source which exhibits a high frequency stability, such as a crystal oscillator.

Since slot line 2 is extended by a quarter wavelength relative to fundamental wave f0 from the upper and lower sections of microstrip line 1, the respective ends of slot line 2 are electrically open ends, viewed from the positions at which slot line 2 traverses microstrip line 1. Therefore, the oscillation component of fundamental wave f0 is efficiently transmitted to a positive feedback loop through slot line 2, thus increasing the Q-value of the oscillator circuit. The length λ/4, by which slot line 2 is extended, need not be strictly equal to λ/4 because this may be such a length that permits the ends of slot line 2 to be regarded as electrically open ends.

However, since the oscillation frequency cannot be made so high in the synchronization signal source, the foregoing injection locked second-harmonic oscillator is typically injected with a synchronization signal at frequency f0/n, where the value n is set to be two or more (n≧2). Consequently, the oscillator is aligned in phase at time intervals of 2/f0 or longer. In this event, the phase is left without synchronization for a longer period in which the phase can vary, possibly leading to a lower frequency stability, as compared with n=1, where the oscillator is aligned in phase at intervals of 1f0. Therefore, when n is set to two or more (n≧2), it is necessary to inject the synchronization signal at a higher level to increase the level of an f0 component contained in the synchronization signal as a harmonic, in order to increase the frequency stability. When the synchronization signal is injected at a higher level, phase noise is also improved in the fundamental frequency (fundamental wave f0) component of the oscillator. Also, since the oscillation frequency is more readily drawn into the synchronization signal, the oscillation frequency can be varied in response to the frequency of the synchronization signal source. In other words, the oscillation frequency can be drawn over a wider frequency range.

For the reason set forth above, a conventional injection locked high frequency oscillator employs a synchronization signal at f0/n, where n≧10, and a step recovery circuit or the like to increase harmonic components contained in the synchronization signal for purposes of increasing the frequency stability.

However, with the second-harmonic oscillator in the configuration described above, when n is set to two or more (n≧2) to increase the level of harmonic components contained in synchronization signal f0/n, fractional harmonic m×f0/n (m is an integer equal to or more than one) for fundamental wave f0 of the oscillator is generated by a similar push-push oscillation mechanism through the two oscillation systems of the second-harmonic oscillator. This causes a problem of increased spurious for a second harmonic component.

SUMMARY OF THE INVENTION

It is an object of the present invention to provide an injection locked multiple harmonic high frequency oscillator which is capable of suppressing spurious to increase the frequency stability, and reducing phase noise to expand a pull-in range.

The object of the present invention can be achieved by a high frequency oscillator which includes a pair of amplifiers for oscillation, a high frequency transmission line for connecting inputs of the pair of amplifiers to each other and connecting outputs of the pair of amplifiers to each other, an electromagnetic coupling member disposed between the inputs and the outputs of the pair of amplifiers for electromagnetically coupling with the high frequency transmission line, a nonlinear circuit for enhancing the level of harmonic components in an applied synchronization signal, a coupler circuit for electromagnetically coupling the output of the nonlinear circuit to the high frequency transmission line, and a filter circuit disposed at the output of the nonlinear circuit, wherein the pair of amplifiers, high frequency transmission line, and electromagnetic coupler form two oscillator loops which oscillate in opposite phases to each other with respect to a fundamental wave of oscillation for generating even-order harmonics of the fundamental wave, and the filter circuit filters harmonic components of the synchronization signal such that the two oscillation systems are injected with the same frequency components as the fundamental wave or frequency components twice as high as the fundamental wave.

DETAILED DESCRIPTION OF THE PREFERRED EMBODIMENTS

Figure 2:
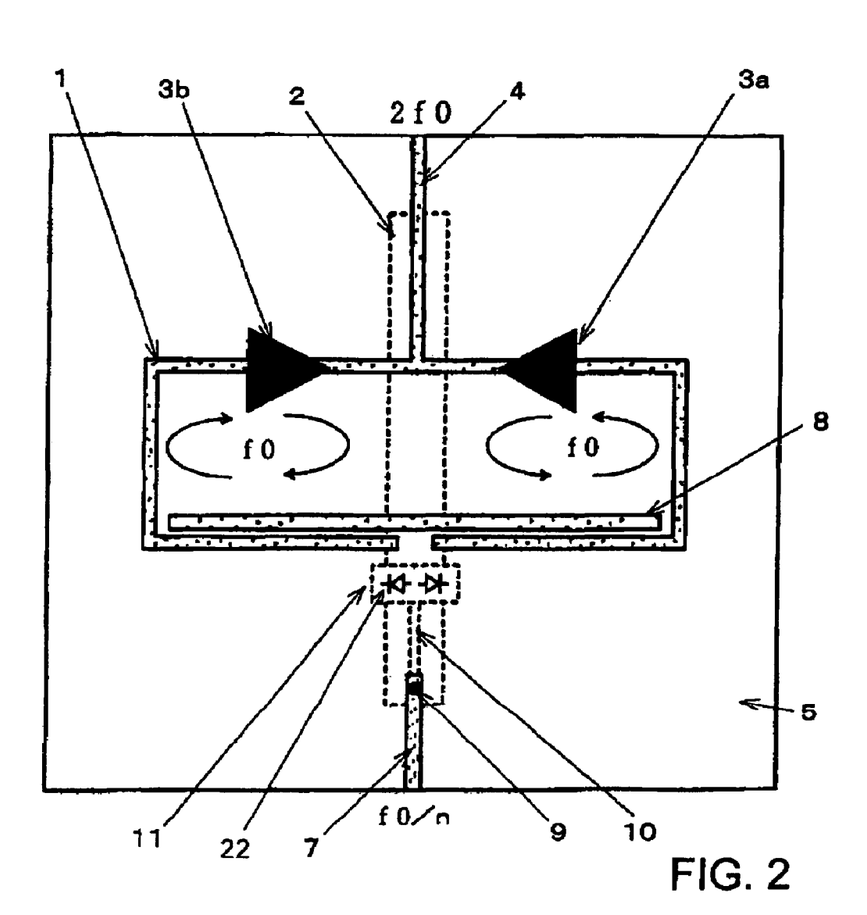
FIG. 2 is a plan view illustrating the configuration of a second-harmonic oscillator according to a first embodiment of the present invention.

A second-harmonic high frequency oscillator according to a preferred embodiment of the present invention illustrated in FIG. 2 adds a mechanism for injecting a synchronization signal to the oscillator illustrated in FIGS. 1A and 1B. In FIG. 2, components identical to those in FIGS. 1A and 1B are designated the same reference numerals, and repeated description thereon is simplified.

The second-harmonic oscillator illustrated in FIG. 2, like the one illustrated in FIGS. 1A and 1B, comprises dielectric substrate 5; a pair of amplifiers 3a, 3b for oscillation mounted on one principal surface of dielectric substrate 5; microstrip line 1 used as a high frequency transmission line to which output line 4 is connected; and slot line 2 which functions as an electromagnetic coupling member for providing opposite phase oscillation. Slot line 2 is formed by creating an aperture line in ground conductor 6 disposed over the entirety of the other principal surface of dielectric substrate 5.

In addition, in the second-harmonic oscillator according to this embodiment, microstrip line 8 for filtering is disposed on the one principal surface of substrate 5 in parallel to and in close proximity to a section of microstrip line 1 which connects between outputs of amplifiers 3a, 3b and traverses slot line 2. Microstrip line 1 for oscillation is divided at a position of this section at which it traverses slot line 2.

Microstrip line 8 for filtering is electromagnetically coupled to microstrip line 1 for oscillation, and traverses slot line 2. Microstrip line 8 extends over a length of approximately λ/4 on both sides of the position at which it traverses slot line 2, where λ is the wavelength corresponding to fundamental frequency f0 for the oscillation of the oscillator.

Injection line 7 for injecting a synchronization signal, which has a microstrip line structure, is routed on the one principal surface of substrate 5. The leading end of injection line 7 extends through via hole 9 to reach the other principal surface of substrate 5, and is connected to line 10 which extends into slot line 2. The leading end of line 10 is connected to a nonlinear circuit, for example, step recovery circuit 11. Step recovery circuit 11 is disposed on the other principal surface of substrate 5 to straddle slot line 2, and is connected to line 10 as well as to ground conductor 6 on both sides of slot line 2. Step recovery circuit 11 as described comprises a pair of step recovery diodes 22, as well as a bias circuit, a matching circuit, and a driver circuit, none of which are shown in FIG. 2.

With the foregoing configuration, the synchronization signal supplied through injection line 7 from an external signal source, the frequency of which is f0/10, passes through step recovery circuit 11 to generate harmonic components, thereby increasing the level of the harmonic components. The synchronization signal with the enhanced harmonic components propagates into slot line 2, and through electromagnetic coupling, propagates to microstrip line 8 which traverses slot line 2.

In this event, since microstrip line 8 has a length of approximately one quarter of wavelength λ of fundamental wave f0 on both sides as described above, when viewed from the point at which microstrip line 8 traverses slot line 2, a fundamental wave (f0) component of the injected synchronization signal propagates into microstrip line 8. Due to the propagation through the electromagnetic coupling between slot line 2 and microstrip line 8, the fundamental wave (f0) components of the synchronization signal are in opposite phases to each other.

Figure 3A:
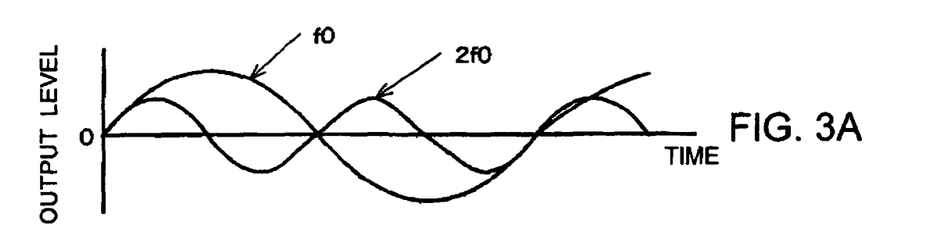
FIGS. 3A to 3C are output waveform charts representing the operation principle of the oscillator illustrated in FIG. 2.
Figure 3B:
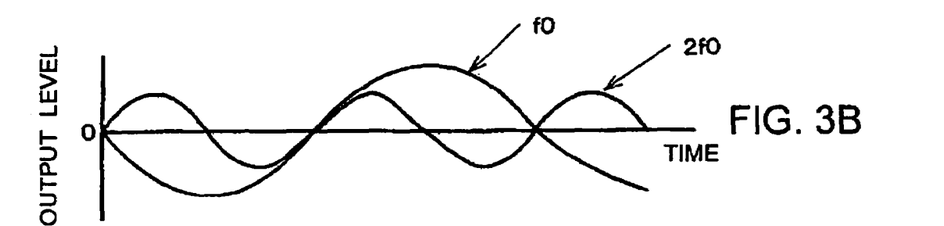
Figure 3C:
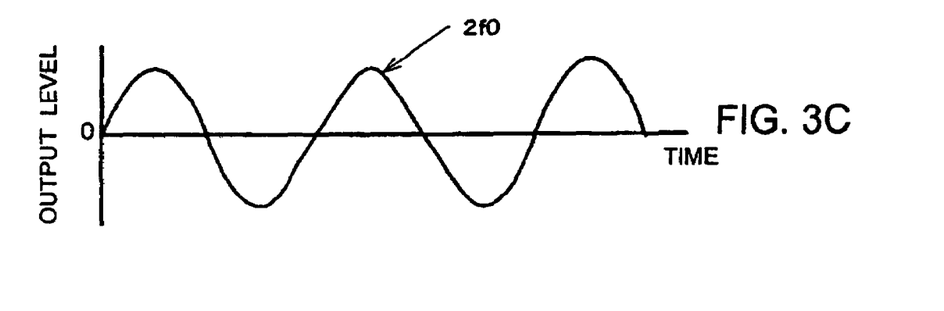

In this way, two oscillation systems, on the left and right sides, of the oscillator are injected with the f0 components, which are tenth harmonics of synchronization signal f0/10, in opposite phases to each other. The oscillation component of fundamental wave f0 in each oscillation system is aligned in phase at time intervals of 1/f0, thereby improving the frequency stability in fundamental wave f0 of the oscillator. This is accompanied with an improved frequency stability of second harmonic 2f0 generated on output line 4, and second harmonic 2f0 is dominant on output line 4 due to a filtering effect of microstrip line 8, thus suppressing spurious associated therewith. Further, this oscillator can reduce phase noise and expand a pull-in range of the oscillation frequency by the synchronization signal. FIG. 3A represents a phase relationship between an oscillated wave and the synchronization signal in the left-hand oscillator as viewed in FIG. 2; FIG. 3C represents a phase relationship between an oscillated wave and the synchronization signal in the right-hand oscillator as viewed inn FIG. 2; and FIG. 3C represents the waveform of a signal which appears on output line 4.

Figure 4:
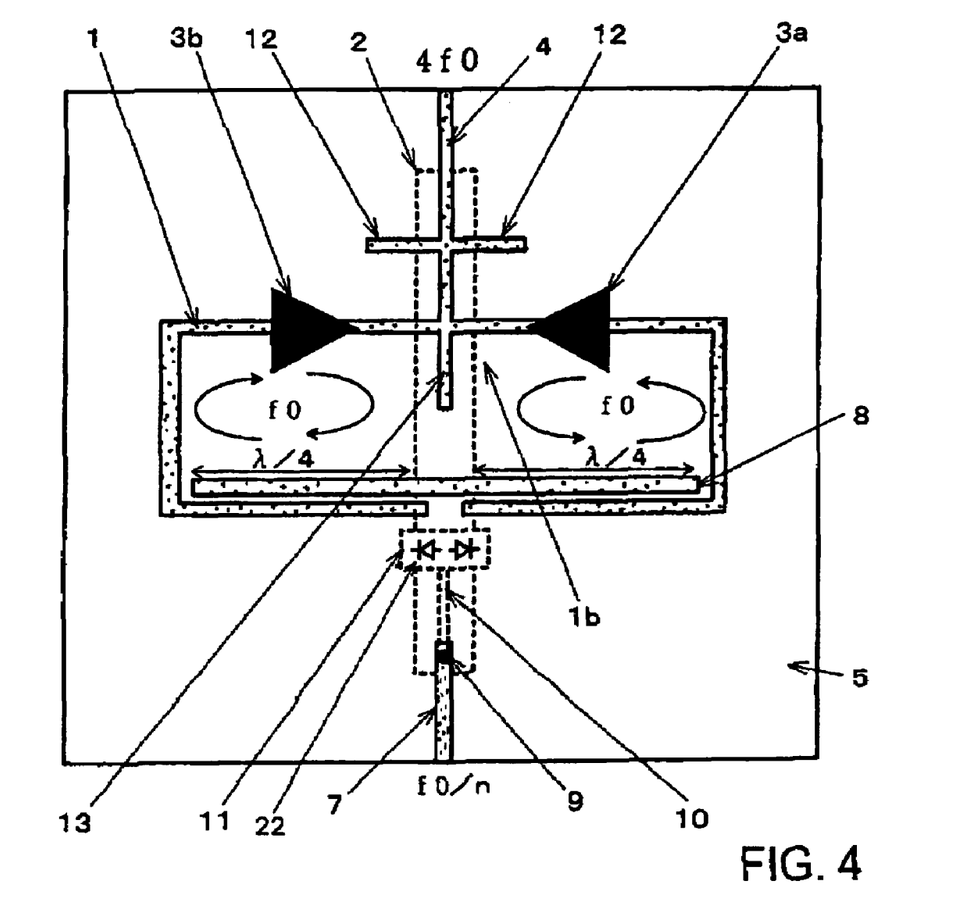
FIG. 4 is a plan view illustrating another example of the second-harmonic oscillator according to the first embodiment.

While the oscillator according to the first embodiment described above is a second-harmonic oscillator for generating a second harmonic among harmonic oscillators, a fourth-harmonic oscillator which supply a frequency component four times as high as a fundamental wave can also be implemented in the first embodiment. FIG. 4 illustrates the configuration of a fourth harmonic oscillator. The fourth harmonic oscillator illustrated in FIG. 4 additionally comprises microstrip line 12, which functions to be a filter for second harmonic 2f0, on one or both sides of output line 4 in the oscillator illustrated in FIG. 2. This microstrip line 12 has a length of approximately one quarter of the wavelength of second harmonic 2f0, and has an open leading end. In other words, microstrip line 12 has a length of approximately λ/8, where λ is the wavelength corresponding to fundamental wave f0. Further, similar microstrip line 13 for filtering is routed internally with respect to loop-shaped microstrip line 1 from a point at which microstrip line 1 is connected to output line 4. Microstrip line 13 is connected to microstrip line 1.

In the configuration as described above, both microstrip lines 12, 13 have electrically short-circuited ends to second harmonic 2f0, as viewed from the connection point of output line 4, thus preventing the second harmonic (2f0) component from appearing at the output end of output line 4. Consequently, output line 4 provides fourth harmonic 4f0, which has the highest level except for the second harmonic, of even-order harmonics for delivery to the outside from output line 4. When output line 4 is additionally provided with a fourth harmonic filter in a similar manner, a sixth harmonic 6f0 or higher harmonics can be generated.

Figure 5:
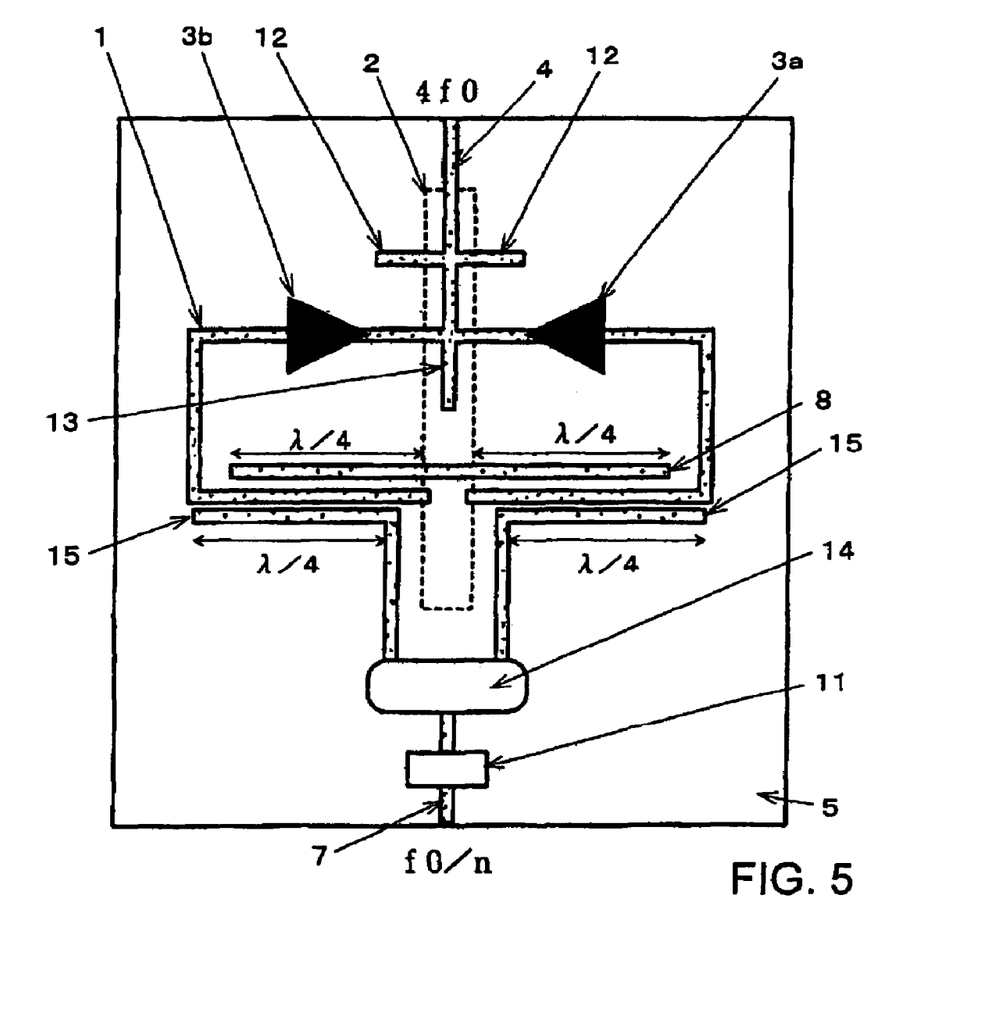
FIG. 5 is a plan view illustrating a further example of the second-harmonic oscillator according to the first embodiment.

In the oscillator illustrated in FIG. 2, microstrip line 8 for filtering is routed to traverse slot line 2 to generate harmonic components of the synchronization signal in opposite phases to each other, which are injected into the respective oscillation systems, but the feature for the injection is not limited to the foregoing. For example, as illustrated in FIG. 5, balun 14 may be connected to step recovery circuit 11 to generate synchronization signals which are in opposite phases to each other. In the oscillator illustrated in FIG. 5, step recovery circuit 11 and balun 14 are mounted on the one principal surface of substrate 5. Step recovery circuit 11 is directly connected to injection line 7, while the output of step recovery circuit 11 is directly supplied to balun 14. On the one principal surface of substrate 5, a pair of microstrip lines 15 are electromagnetically coupled to microstrip line 1 for oscillation from the outside. Each of microstrip lines 15 has a length of approximately λ/4. Microstrip lines 15 extend from positions corresponding to both side edges of slot line 2 in directions away from slot line 2, respectively. A balanced output from balun 14 is branched and supplied to this pair of microstrip lines 15.

In the foregoing configuration, the respective oscillation systems are injected with harmonic components (i.e., f0 components) of the synchronization signal in opposite phases to each other. The oscillator illustrated in FIG. 5 is similar to the oscillator illustrated in FIG. 4 in that microstrip lines 8 are routed over a length of λ/4, respectively, on both sides from a point at which it traverses slot line 2, where λ is the wavelength of oscillation fundamental wave f0.

In the circuit illustrated in FIG. 5, if step recovery circuit 11 generates balanced outputs which are the synchronization signals in opposite phases to each other, no balun is not required.

Figure 6:
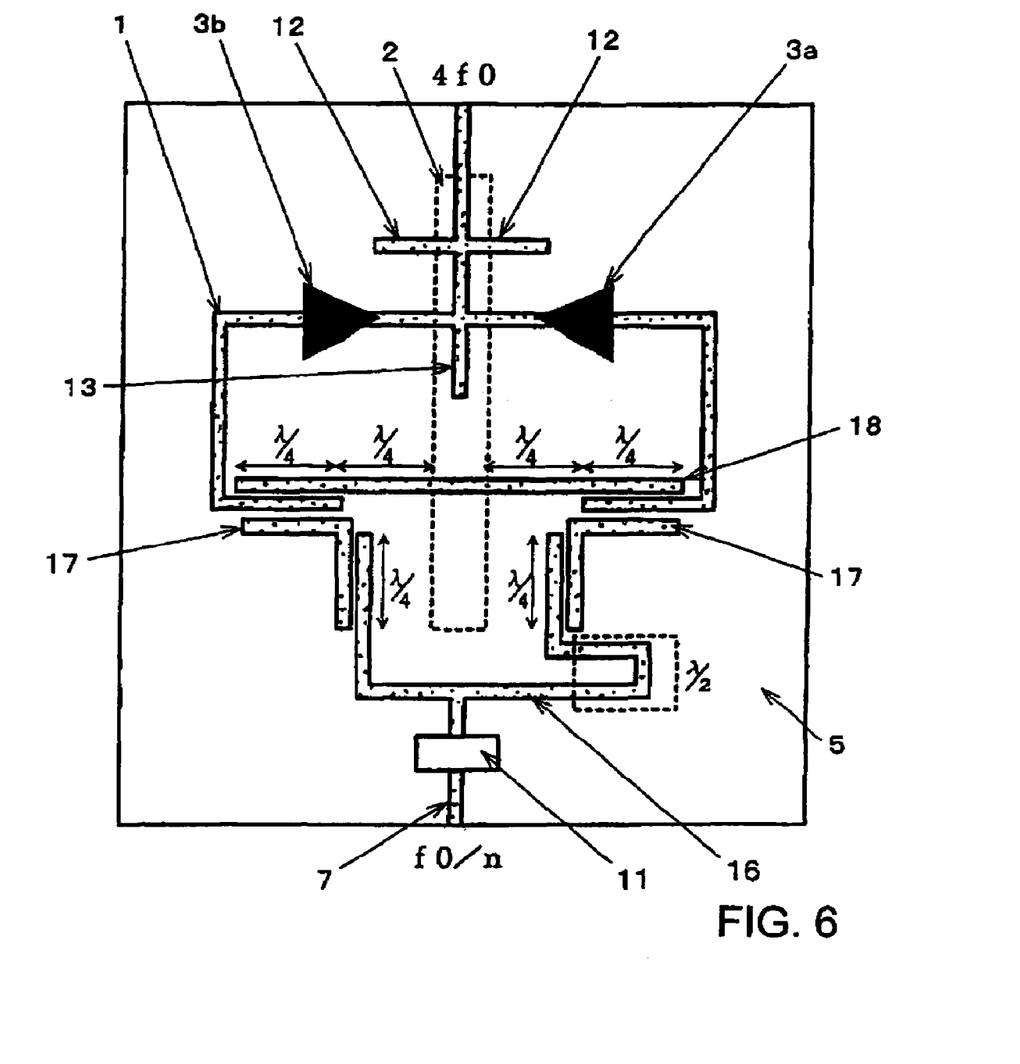
FIG. 6 is a plan view illustrating a further example of the second-harmonic oscillator according to the first embodiment.

An oscillator illustrated in FIG. 6 comprises branched microstrip line 16 on the one principal surface of substrate 5 for connection to the output of step recovery circuit 11 instead of balun 14 employed in the circuit illustrated in FIG. 5. Branched microstrip line 16, which functions to inject opposite-phase synchronization signals to the left- and right-hand oscillation systems, has one branch which has a length longer than the length of the other branch by approximately one-half of wavelength λ corresponding to fundamental wave f0. In other words, the one branch acts as a delay line. Then, the synchronization signal containing the frequency (f0) component is introduced into the left- and right-hand oscillation systems through branched microstrip line 16. Here, L-shaped microstrip line 17 is routed along each leading end portion of branched microstrip line 16 and microstrip line 1. Each of the wings of L-shaped microstrip line 7 has a length of λ/4. As a result, filters are cascaded in two stages for passing fundamental wave component f0 therethrough. In the circuit of FIG. 6, microstrip line 1 is not cut at the position at which it traverses slot line 2.

Figure 7:
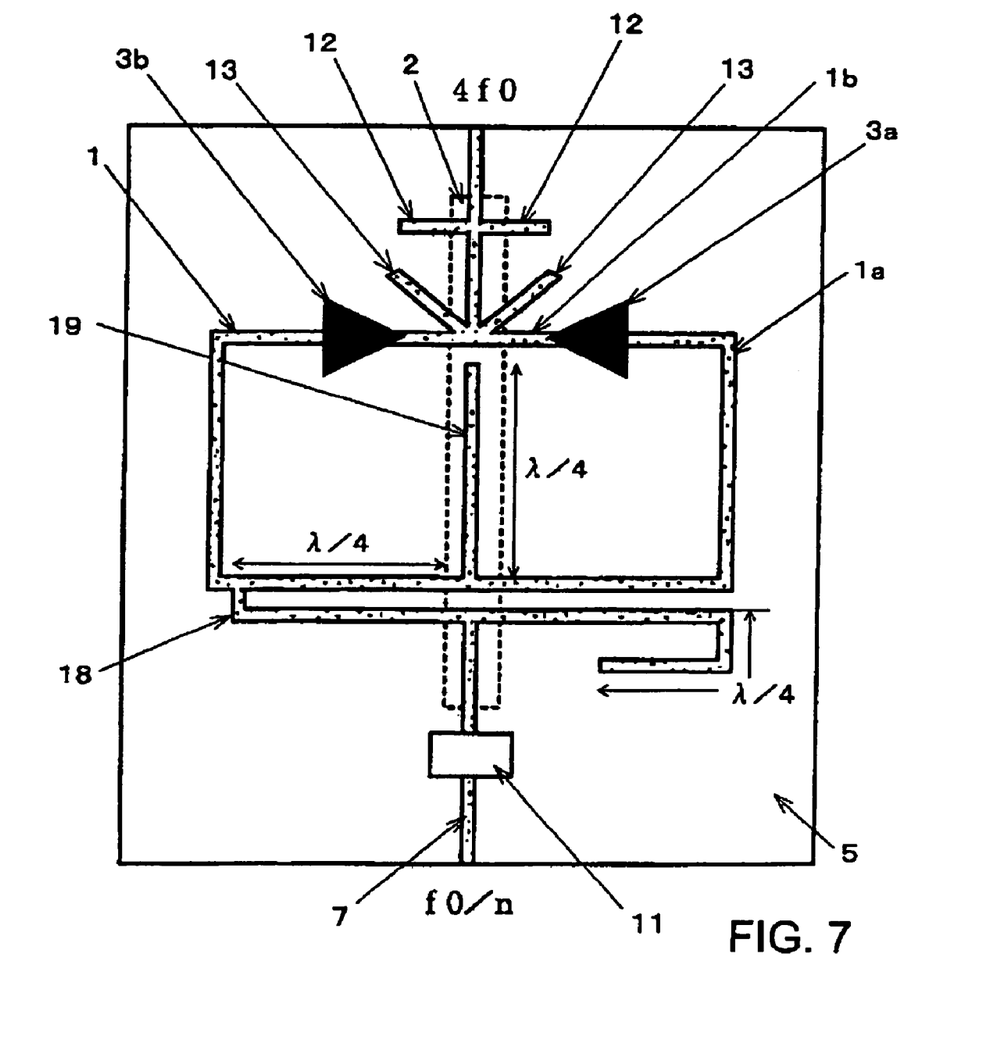
FIG. 7 is a plan view illustrating a further example of the second-harmonic oscillator according to the first embodiment.

An oscillator illustrated in FIG. 7 comprises microstrip line 18 which is routed on the one principal surface of substrate 5 in parallel to and in close proximity to microstrip line 1, and connected to microstrip line 1 near a lower left corner thereof. Microstrip line 18 further traverses slot line 2, and extends toward a lower right corner of microstrip line 1, as viewed in FIG. 7. The length of microstrip line 18 from the point at which it traverses microstrip line 2 to the point at which it is connected to microstrip line 1 is approximately λ/4, where λ is the wavelength corresponding to fundamental wave f0. A right end portion of microstrip line 18 is folded back such that the leading end thereof is oriented to the inside, and the length of microstrip line 18 from the point at which it traverses slot line 2 to the leading end is set to approximately λ/4. Microstrip line 18 is supplied with a synchronization signal from step recovery circuit 11 at the position at which it traverses slot line 2. In the circuit of FIG. 7, microstrip line 1 is not cut at the position at which it traverses slot line 2.

Likewise, in the foregoing configuration, the frequency (f0) components of the synchronization signal are injected into the respective oscillation systems in opposite phases to each other at both end sides of microstrip line 1. Additionally, microstrip line 19 extends from the midpoint of microstrip line 1 along slot line 2 over a length of approximately λ/4. With the provision of such microstrip line 19, a null potential point is set on microstrip line 1 at the position at which microstrip line 1 traverses slot line 2.

Figure 8:
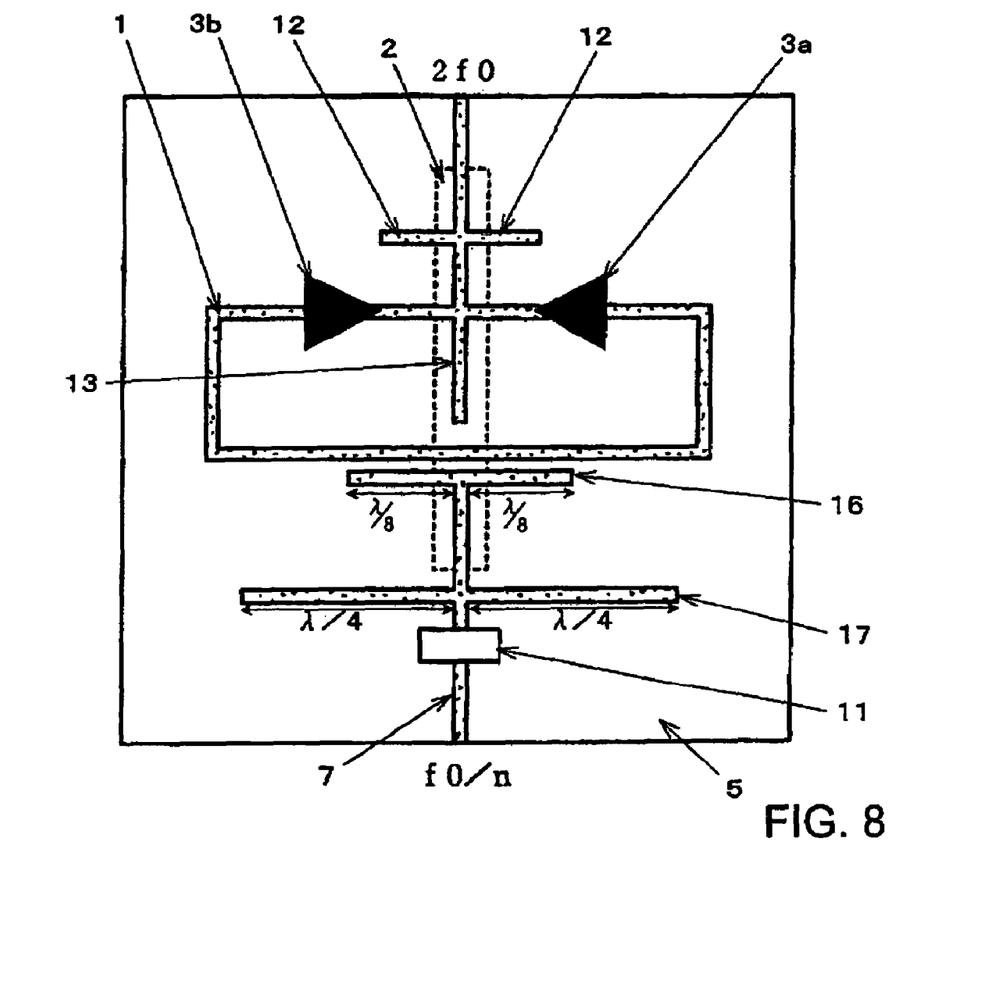
FIG. 8 is a plan view illustrating a second-harmonic oscillator according to a second embodiment of the present invention.

FIG. 8 illustrates a second-harmonic oscillator according to a second embodiment of the present invention. This second-harmonic oscillator injects each oscillation system with a synchronization signal which contains a second-harmonic (2f0) component, where f0 is the fundamental frequency for the oscillation of the oscillator. This oscillator, though similar in configuration to those illustrated in FIGS. 6 and 7, differs from them in the following aspects.

In the second-harmonic oscillator illustrated in FIG. 8, microstrip line 16 for filtering is routed on one principal surface of substrate 5 in parallel to and in close proximity to a section of microstrip line 1 which connects between the outputs of amplifiers 3a, 3b and traverses slot line 2. Microstrip line 16 for filtering extends on both sides from a point at which it traverses slot line 2 by a length of approximately λ/8, i.e., one quarter of the wavelength of second harmonic 2f0, and is electromagnetically coupled to microstrip line 1 for oscillation. In this configuration, microstrip line 1 for oscillation is not cut at the position at which it traverses slot line 2. At the position at which microstrip line 16 traverses slot line 2, a signal line from the output of step recovery circuit 11 is connected to microstrip line 16. Connected to this signal line is microstrip line 17 for filtering which extends on both sides by a length of approximately λ/4 from the signal line at a position at which slot line 2 is not provided.

A synchronization signal supplied to step recovery circuit 11 has a frequency of, for example, f0/10, where f0 is the frequency of the fundamental wave of the oscillation systems, as is the case with the aforementioned embodiments.

In the configuration as described above, harmonic components, which have been increased in level in step recovery circuit 11, first pass through microstrip line 8 which filters out a tenth harmonic of the synchronization signal, i.e., a frequency f0 component. Next, second harmonic 2f0, which is a twentieth harmonic of synchronization signal f0/10, is extracted by microstrip line 16 which has a length equal to one quarter wavelength with respect to second harmonic 2f0, for injection into microstrip line 1 for oscillation. In this event, on both sides of slot line 2, microstrip line 16 for filtering and microstrip line 1 for oscillation accomplish in-phase electromagnetic coupling.

In the circuit illustrated in FIG. 2, microstrip line 1 is cut at the position where microstrip line 1 traverses slot line 2 because microstrip line 8 is electromagnetically coupled to microstrip line 1 for oscillation on both sides of slot line 2 in opposite phases. In the circuit illustrated in FIG. 8, on the other hand, microstrip line 1 need not be cut, and is therefore left connected (short-circuited) because of the in-phase coupling of microstrip line 1 to microstrip line 8.

Figure 9A:
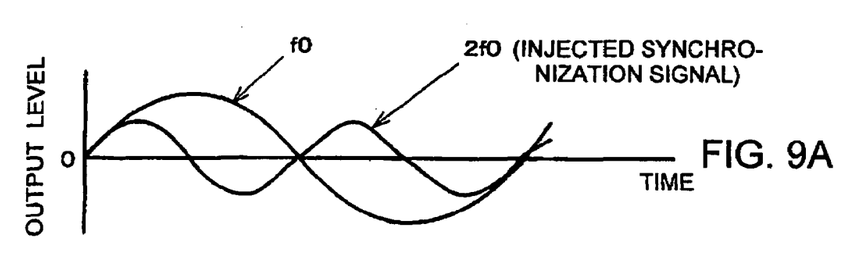
FIGS. 9A to 9C are output waveform charts representing the operation principle of the oscillator illustrated in FIG. 6.
Figure 9B:
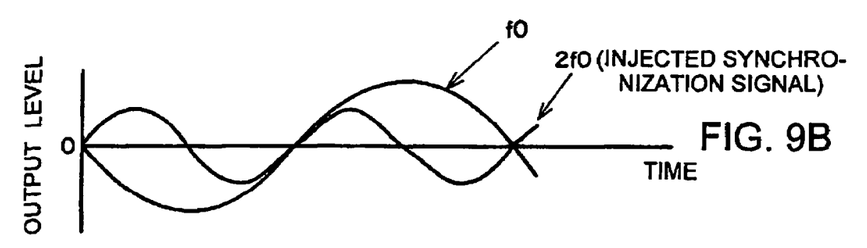
Figure 9C:
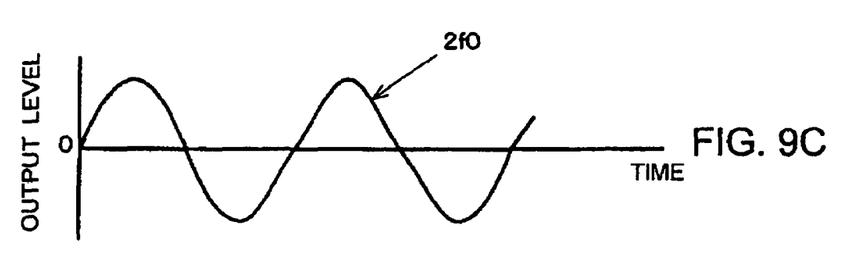

In this way, in the circuit illustrated in FIG. 8, second harmonic components 2f0 are injected to the left- and right-hand oscillation systems, respectively, in phase. In this event, synchronization is established every time interval of 1/f0 for fundamental waves f0, which are in phase to each other, in the left- and right-hand oscillation systems. FIG. 9A represents a phase relationship between an oscillated wave and the synchronization signal in the left-hand oscillation system, as viewed in FIG. 8; FIG. 9B represents a phase relationship between an oscillated wave and the synchronization signal in the left-hand oscillation system, as viewed in FIG. 8; and FIG. 9C represents the waveform of a signal which appears on the output line.

As described above, the second embodiment can also increase the frequency stability of generated second harmonic 2f0. Also, since harmonic components of the synchronization signal except for 2f0 are reduced in level by microstrip line 8 for filtering, the oscillator according to the second embodiment can suppress spurious, reduce phase noise, and expand a pull-In range.

In the second embodiment, fourth harmonic 4f0 can also be generated by connecting microstrip line 8 for filtering to output line 4, microstrip line 8 having a length equal to one quarter wavelength with respect to second harmonic 2f0. Similarly, sixth harmonic 6f0 and an eighth harmonic 8f0 can also be generated by additionally providing a microstrip line for filtering fourth harmonic 4f0.

In the foregoing description, the synchronization signal is at frequency f0/10, where f0 is the frequency of the fundamental wave for the oscillator, but the frequency of the synchronization signal is not limited to that. More generally, the frequency of the synchronization signal may be represented by f0/n, where n is an integer equal to or more than two.

Also, while a slot line is used for the electromagnetic coupling member disposed between the inputs and the outputs of the pair of amplifiers for electromagnetic coupling with the microstrip line, the electromagnetic coupling member is not limited to the slot line. A dielectric resonator may be used instead for electromagnetically coupling with the upper side and lower side of a loop-shaped microstrip line. In this alternative, an induced current is generated in microstrip line 1 by a magnetic field from the dielectric resonator. This induced current flows in opposite directions on the left side and on the right side of loop-shaped microstrip line 1. Also, the induced current flows in the same direction on both sides of a portion of the upper side of microstrip line 1 which is in contact with the dielectric resonator. Likewise, the induced current flows in the same direction on both sides of a portion of the lower side of microstrip line 1 which is in contact with the dielectric resonator. Therefore, considering in the upper side or lower side of microstrip line 1, the left- and right-hand oscillation systems have the induced currents in opposite phases to each other, and the two oscillation systems oscillate in opposite phases to each other.

Further, the nonlinear circuit is not limited to the step recovery circuit, but any arbitrary circuit can be used as long as it is capable of enhancing harmonic components.

What is claimed is:

1. A high frequency oscillator, comprising:
   a pair of amplifiers for oscillation;
   a high frequency transmission line for connecting inputs of said pair of amplifiers to each other and connecting outputs of said pair of amplifiers to each other;
   an electromagnetic coupling member disposed between the inputs and the outputs of said pair of amplifiers for electromagnetically coupling with said high frequency transmission line;
   a nonlinear circuit for enhancing a level of harmonic components in a synchronization signal which is applied to the nonlinear circuit;
   a coupler circuit for electromagnetically coupling an output of said nonlinear circuit to said high frequency transmission line; and
   a filter circuit disposed at the output of said nonlinear circuit, wherein said pair of amplifiers, said high frequency transmission line, and said electromagnetic coupler form two oscillator systems which oscillate in opposite phases to each other with respect to a fundamental wave of oscillation for generating even-order harmonics of the fundamental wave, and said filter circuit filters harmonic components of the synchronization signal such that said two oscillation systems are injected with the same frequency component as the fundamental wave, and wherein said same frequency component as the fundamental wave is injected into said two oscillation systems in opposite phases.

2. A high frequency oscillator according to claim 1, comprising:
   a pair of amplifiers for oscillation:
   a high frequency transmission line for connecting inputs of said pair of amplifiers to each other and connecting outputs of said pair of amplifiers to each other;
   an electromagnetic coupling member disposed between the inputs and the outputs of said pair of amplifiers for electromagnetically coupling with said high frequency transmission line;
   a nonlinear circuit for enhancing a level of harmonic components in an applied synchronization signal, wherein said nonlinear circuit comprises a step recovery circuit;
   a coupler circuit for electromagnetically coupling an output of said nonlinear circuit to said high frequency transmission line; and
   a filter circuit disposed at the output of said nonlinear circuit, wherein said pair of amplifiers, said high frequency transmission line, and said electromagnetic coupler form two oscillator systems which oscillate in opposite phases to each other with respect to a fundamental wave of oscillation for generating even-order harmonics of the fundamental wave, and said filter circuit filters harmonic components of the synchronization signal such that said two oscillation systems are injected with the same frequency component as the fundamental wave.

3. The oscillator according to claim 1, wherein said high frequency transmission line comprises a microstrip line routed on one principal surface of a dielectric substrate, and said electromagnetic coupling member comprises a slot line routed on the other principal surface of said dielectric substrate.

4. The oscillator according to claim 1, further comprising an output line connected to said high frequency transmission line at a position at which said high frequency transmission line traverses said slot line between the outputs of said pair of amplifiers or between the inputs of said pair of amplifiers.

5. The oscillator according to claim 4, further comprising a filter disposed on said output line for selecting a frequency component.

6. A high frequency resonator, comprising:
   a pair of amplifiers for oscillation;
   a high frequency transmission line for connecting inputs of said pair of amplifiers to each other and connecting outputs of said pair of amplifiers to each other;
   an electromagnetic coupling member disposed between the inputs and the outputs of said pair of amplifiers for electromagnetically coupling with said high frequency transmission line;
   a nonlinear circuit for enhancing a level of harmonic components in a synchronization signal which is applied to the nonlinear circuit;
   a coupler circuit for electromagnetically coupling an output of said nonlinear circuit to said high frequency transmission line; and
   a filter circuit disposed at the output of said nonlinear circuit, wherein said pair of amplifiers, said high frequency transmission line, and said electromagnetic coupler form two oscillator systems which oscillate in opposite phases to each other with respect to a fundamental wave of oscillation, for generating even-order harmonics of the fundamental wave, and said filter circuit filters harmonic components of the synchronization signal such that said two oscillation systems are injected with a frequency component twice as high as the fundamental wave, wherein said frequency component twice as high as the fundamental wave is injected into said two oscillation systems in phase.

7. A high frequency resonator, comprising:
   a pair of amplifiers for oscillation:
   a high frequency transmission line for connecting inputs of said pair of amplifiers to each other and connecting outputs of said pair of amplifiers to each other;
   an electromagnetic coupling member disposed between the inputs and the outputs of said pair of amplifiers for electromagnetically coupling with said high frequency transmission line;
   a nonlinear circuit for enhancing a level of harmonic components in an applied synchronization signal, wherein said nonlinear circuit comprises a step recovery circuit;
   a coupler circuit for electromagnetically coupling an output of said nonlinear circuit to said high frequency transmission line; and a filter circuit disposed at the output of said nonlinear circuit, wherein said pair of amplifiers, said high frequency transmission line, and said electromagnetic coupler form two oscillator systems which oscillate in opposite phases to each other with respect to a fundamental wave of oscillation, for generating even-order harmonics of the fundamental wave, and said filter circuit filters harmonic components of the synchronization signal such that said two oscillation systems are injected with a frequency component twice as high as the fundamental wave.

8. The resonator according to claim 6, wherein said high frequency transmission line comprises a microstrip line routed on one principal surface of a dielectric substrate, and said electromagnetic coupling member comprises a slot line routed on the other principal surface of said substrate.

9. The resonator according to claim 6, further comprising an output line connected to said high frequency transmission line at a position at which said high frequency transmission line traverses said slot line between the outputs of said pair of amplifiers or between the inputs of said pair of amplifiers.

10. The resonator according to claim 9, further comprising a filter disposed on said output line for selecting a frequency component.

11. The oscillator according to claim 1, wherein said nonlinear circuit comprises a step recovery circuit.

12. The resonator according to claim 6, wherein said nonlinear circuit comprises a step recovery circuit.

* * * * *